US010403626B2

(12) United States Patent
Glass et al.

(10) Patent No.: US 10,403,626 B2
(45) Date of Patent: Sep. 3, 2019

(54) FIN SCULPTING AND CLADDING DURING REPLACEMENT GATE PROCESS FOR TRANSISTOR CHANNEL APPLICATIONS (71) Applicant: INTEL CORPORATION, Santa Clara, CA (US)

(72) Inventors: Glenn A. Glass, Portland, OR (US); Anand S. Murthy, Portland, OR (US); Daniel B. Aubertine, North Plains, OR (US); Subhash M. Joshi, Hillsboro, OR (US)

(73) Assignee: INTEL CORPORATION, Santa Clara, CA (US)

( * ) Notice: Subject to any disclaimer, the term of this patent is extended or adjusted under 35 U.S.C. 154(b) by 0 days.

(21) Appl. No.: 15/115,825

(22) PCT Filed: Mar. 24, 2014

(86) PCT No.: PCT/US2014/031603
§ 371 (c)(1),
(2) Date: Aug. 1, 2016

(87) PCT Pub. No.: WO2015/147784
PCT Pub. Date: Oct. 1, 2015

(65) Prior Publication Data
US 2017/0133376 A1    May 11, 2017

(51) Int. Cl.
*H01L 29/10* (2006.01)
*H01L 29/66* (2006.01)
(Continued)

(52) U.S. Cl.
CPC .... *H01L 27/0924* (2013.01); *H01L 21/02532* (2013.01); *H01L 21/3065* (2013.01);
(Continued)

(58) Field of Classification Search
CPC ........... H01L 29/1054; H01L 29/66818; H01L 21/823412; H01L 21/823807
See application file for complete search history.

(56) References Cited

U.S. PATENT DOCUMENTS

| 8,441,074 B2 | 5/2013 | Rachmady et al. |
| 2005/0145926 A1 | 7/2005 | Lee |

(Continued)

FOREIGN PATENT DOCUMENTS

| CN | 1855390 | 11/2006 |
| CN | 103515422 A | 1/2014 |

(Continued)

OTHER PUBLICATIONS

Taiwan Office Action and Search Report received for TW Application No. 105128468, dated Feb. 16, 2017. 15 pages (including English translation).

(Continued)

*Primary Examiner* — Thanhha S Pham
(74) *Attorney, Agent, or Firm* — Finch & Maloney PLLC (57) ABSTRACT

Techniques are disclosed for sculpting and cladding the channel region of fins on a semiconductor substrate during a replacement gate process (e.g., for transistor channel applications). The sculpting and cladding can be performed when the channel region of the fins are re-exposed after the dummy gate used in the replacement gate process is removed. The sculpting includes performing a trim etch on the re-exposed channel region of the fins to narrow a width of the fins (e.g., by 2-6 nm). A cladding layer, which may include germanium (Ge) or silicon germanium (SiGe), can then be deposited on the trimmed fins, leaving the source/drain regions of the fins unaffected. The sculpting and (Continued)

cladding may be performed in-situ or without air break to increase the quality of the trimmed fins (e.g., as compared to an ex-situ process).

23 Claims, 7 Drawing Sheets

(51) Int. Cl.
    *H01L 27/092* (2006.01)
    *H01L 21/8238* (2006.01)
    *H01L 29/78* (2006.01)
    *H01L 21/02* (2006.01)
    *H01L 21/3065* (2006.01)
    *H01L 21/8234* (2006.01)
    *H01L 27/088* (2006.01)
    *H01L 29/06* (2006.01)
    *H01L 29/08* (2006.01)
    *H01L 29/165* (2006.01)

(52) U.S. Cl.
    CPC ........... *H01L 21/823431* (2013.01); *H01L 21/823437* (2013.01); *H01L 21/823821* (2013.01); *H01L 21/823828* (2013.01); *H01L 27/0886* (2013.01); *H01L 29/0649* (2013.01); *H01L 29/0847* (2013.01); *H01L 29/1033* (2013.01); *H01L 29/1054* (2013.01); *H01L 29/165* (2013.01); *H01L 29/66545* (2013.01); *H01L 29/66795* (2013.01); *H01L 29/66818* (2013.01); *H01L 29/785* (2013.01)

(56) References Cited

U.S. PATENT DOCUMENTS

| | | |
|---|---|---|
| 2006/0216897 A1 | 9/2006 | Lee |
| 2010/0252816 A1 | 10/2010 | Ko et al. |
| 2013/0105867 A1 | 5/2013 | Wang et al. |
| 2013/0200433 A1 | 8/2013 | Adam et al. |
| 2013/0200483 A1 | 8/2013 | Tung |
| 2013/0221448 A1 | 8/2013 | Chang et al. |
| 2013/0313610 A1 | 11/2013 | Sell |
| 2013/0334606 A1 | 12/2013 | Shen et al. |
| 2014/0027816 A1 | 1/2014 | Cea et al. |
| 2015/0214365 A1* | 7/2015 | Xie ............. H01L 29/7842 257/369 |

FOREIGN PATENT DOCUMENTS

| | | |
|---|---|---|
| TW | 200423405 A | 6/2010 |
| TW | 201301508 A | 1/2013 |
| TW | 201318069 A | 5/2013 |
| TW | 201318077 A | 5/2013 |
| WO | 2015147784 A1 | 10/2015 |

OTHER PUBLICATIONS

International Search Report and Written Opinion received in PCT Application No. PCT/US14/031603. dated Dec. 18, 2014, 13 pages.
Office Action and Search Report received for TW Application No. 104104229, dated Dec. 23, 2015. 10 pages; including 6 pages of English translation.
International Preliminary Report on Patentability received in PCT Application No. PCT/US14/031603. dated Oct. 6, 2016. 9 pages.
Extended European Search Report received for EP Application No. 14887405.0, dated Sep. 21, 2017. 8 pages.

* cited by examiner

FIN SCULPTING AND CLADDING DURING REPLACEMENT GATE PROCESS FOR TRANSISTOR CHANNEL APPLICATIONS

BACKGROUND

Increased performance and yield of circuit devices on a substrate, including transistors, diodes, resistors, capacitors, and other passive and active electronic devices formed on a semiconductor substrate, are typically a major factor considered during design, manufacture, and operation of those devices. For example, during design and manufacture or forming of metal-oxide-semiconductor (MOS) transistor semiconductor devices, such as those used in complementary metal-oxide-semiconductor (CMOS) devices, it is often desired to increase movement of electrons (carriers) in n-type MOS device (n-MOS) channels and to increase movement of positive charged holes (carriers) in p-type MOS device (p-MOS) channels. Finned transistor configurations include a transistor built around a thin strip of semiconductor materials (generally referred to as the fin). The transistor includes the standard field effect transistor (FET) nodes, including a gate, a gate dielectric, a source region, and a drain region. The conductive channel of the device effectively resides on the outer sides of the fin, beneath the gate dielectric. Specifically, current runs along/within both sidewalls of the fin (sides substantially perpendicular to the substrate surface) as well as along the top of the fin (side substantially parallel to the substrate surface). Because the conductive channel of such configurations essentially resides along the three different outer, planar regions of the fin, such configurations have been termed as finFET and tri-gate transistors. Other types of finned configurations can also be used, such as so-called double-gate finFETs, in which the conductive channel principally resides only along the two sidewalls of the fin (and not along the top of the fin, for example).

BRIEF DESCRIPTION OF THE DRAWINGS

FIG. 7 continues from FIG. 6C and illustrates the resulting structure after performing a trim etch of the channel region of the fins to achieve trimmed fins in the channel region, in accordance with an embodiment; FIGS. 6C and 7 may also be viewed as cross-sections taken at different locations of the same two fins post trim etch, in accordance with an embodiment.

FIG. 9' shows an enlarged view of the clad trimmed fin in the channel region of the structure shown in FIG. 9.

DETAILED DESCRIPTION

Techniques are disclosed for sculpting and cladding the channel region of fins on a semiconductor substrate during a replacement gate process (e.g., for transistor channel applications). The sculpting and cladding are performed when the channel region of the fins are re-exposed after the dummy gate used in the replacement gate process is removed. In some embodiments, the sculpting includes performing a trim etch on the re-exposed channel region of the fins to narrow the width of the fins (e.g., by 2-6 nm). The trim etch may include, for instance, low ion energy plasma processing or thermal processing. A cladding layer, which may include germanium (Ge) or silicon germanium (SiGe), in some embodiments, can then be deposited on the trimmed fins, leaving the source/drain regions of the fins unaffected. The sculpting and cladding may be performed in-situ or without air break to increase the quality of the trimmed fins (e.g., as compared to an ex-situ process). In some cases, the clad fins may have a width of less than 20 nm. Numerous configurations and variations will be apparent in light of this disclosure.

General Overview

There are a number of non-trivial issues associated with fabricating fin-based transistors. In the context of germanium (Ge) containing cladding layers on a silicon (Si) fin (e.g., for fabrication of SiGe alloy and Ge containing clad channel transistors), it is desirable to minimize the width of the Si fin layer, in some cases, as much as possible. The Si fin may provide a template (e.g., a core) for the cladding layer to be deposited upon or grown from (e.g., epitaxially). The quality of the cladding layers can depend on the quality of the Si fin core that is used as the starting template for growth. In some cases, it may be advantageous to minimize the total fin width (Si core plus any cladding layers), to improve transistor performance.

Thus, and in accordance with one or more embodiments of the present disclosure, techniques are provided for sculpting and cladding the channel region of fins on a substrate during a replacement gate process for semiconductor device applications (e.g., for transistor channel applications). The sculpting and cladding can be performed, for example, when the channel region is re-exposed after the dummy gate used in the replacement gate process is removed. In some embodiments, sculpting the channel region of the fins includes performing a trim etch to narrow the width of the fins in that region. The trim etch may include, for example, low ion energy plasma processing (e.g., using Cl based chemistry) or thermal processing (e.g., using HCl or $Cl_2$).

The trimmed fins can then be clad by selectively depositing a cladding layer thereon. In some embodiments, the trim etch and cladding is performed inside an epitaxial deposition toolset (or epitaxial reactor) or in-situ. The term "in-situ" as used herein generally includes keeping or maintaining the work piece (e.g., substrate and fins) within a vacuum sealed environment or system, so that the work piece is not exposed to air, even if relocated to different areas/chambers within the environment or system. Fin width trim etches that are typically performed outside of the epitaxial deposition toolset (ex-situ) may rely on dry etching, which can involve high energy ion bombardment, oxidation, and etch residues that can all be damaging to the quality of subsequently deposited layers (e.g., a subsequently deposited cladding layer). To this end, performing the trim etch in-situ as variously described herein may increase the quality of the trimmed fins for subsequent deposition of the cladding layer. For example, using the low ion energy plasma processing or thermal processing previously described would not damage the fins via energetic ion bombardment, oxidation, or by leaving behind etch residue that could disrupt deposition of the cladding layer.

The cladding material may include Ge, and in some cases, may be SiGe, although other suitable cladding materials can be used depending on the application (e.g., n-MOS, p-MOS) and as will be appreciated in light of this disclosure. The clad trimmed channel region of the fins can then be used for channel applications for semiconductor devices, such as for transistor devices (e.g., p-MOS, n-MOS, or CMOS finned transistor devices). Because the sculpting and cladding are performed during the replacement gate process, when only the channel region of the fins are exposed, the source and drain regions of the fins are unaffected.

In some embodiments, the fin trim etch is performed to form narrower fin widths, upon which the cladding layer can be deposited. Reducing the fin width in the channel region can make it easier to electronically invert the channel by application of gate bias and reduce carrier leakage when the gate is not biased. Note that the channel region of the fins before trim etch have an initial/first width (W1) (e.g., greater than 20 or 30 nm), and after trim etch, the fins have a second width (W2) (e.g., 15, 10, or 5 nm). Further note that by starting with a wider fin and trimming the channel region of the fin to the desired size just before depositing the cladding layer can expose fresh fin material to give the epitaxial deposition process a better chance of depositing a defect free layer, or at least a cleaner layer than would otherwise be deposited. In some embodiments, the trim etch causes the channel region of the fins to narrow by 2-6 nm. In some cases, further note that only a portion of the fin may be thinned, such as the case where the initially formed fins are tapered (e.g., where the top is thinner than the base). In such cases, the trim etch can be used to shape the fins to be straight (rather than tapered).

In some embodiments, it may be desirable to reduce the height of the fins as little as possible while performing the trim etch. For example, it may be desirable to ensure trimmed fins have a trimmed height of 20 nm or more above the trench oxide plane. Therefore, in some embodiments, it may be desirable to start off with a high initial fin height (e.g., greater than 25, 30, 50, or 75 nm). Further note that after cladding the trimmed fins, the clad fins (the trimmed fin portion plus the cladding layer) have a third width (W3), which in some embodiments, may be less than 20 nm. In some such cases, the aspect ratio (height:width) of the clad trimmed fin is at least 2:1.

Upon analysis (e.g., scanning/transmission electron microscopy and/or composition mapping), a structure configured in accordance with one embodiment will effectively show channel regions with a cladding layer/material deposited on trimmed fins. In addition, the trimmed fins may have a second width (W2) in the channel region that is less than a first/initial width (W1) of the fins (e.g., before they were trimmed). Because the sculpting and cladding processes are performed after only the channel region is re-exposed during a replacement gate process, the fin shape in the source/drain regions will be unaffected. Therefore, the width of the fins in the source and drain regions (which should be equal or similar to the initial width W1 of the fins, as long as no other processing is performed to trim the fins in the source/drain regions) can be inspected and compared to the width of the fins in the trimmed channel region (W2). Also, in some cases, transistors fabricated using the trimming and sculpting processes as variously described herein can provide an improvement over conventional structures with respect to, at least, a reduction in the adjacent resistance paths through the source/drain regions (as well as any related tip regions and the contacts) due to the physically wider dimension of the fin in the source/drain regions (as compared to the fin in the channel region). Further, the cleanliness of the interface between the trimmed fin and cladding layer in the channel region (e.g., when sculpting and cladding are performed in-situ) can be detected by secondary ion mass spectrometry (SIMS) or by ion probe, for example. Numerous configurations and variations will be apparent in light of this disclosure.

Methodology and Architecture

Figure 1:
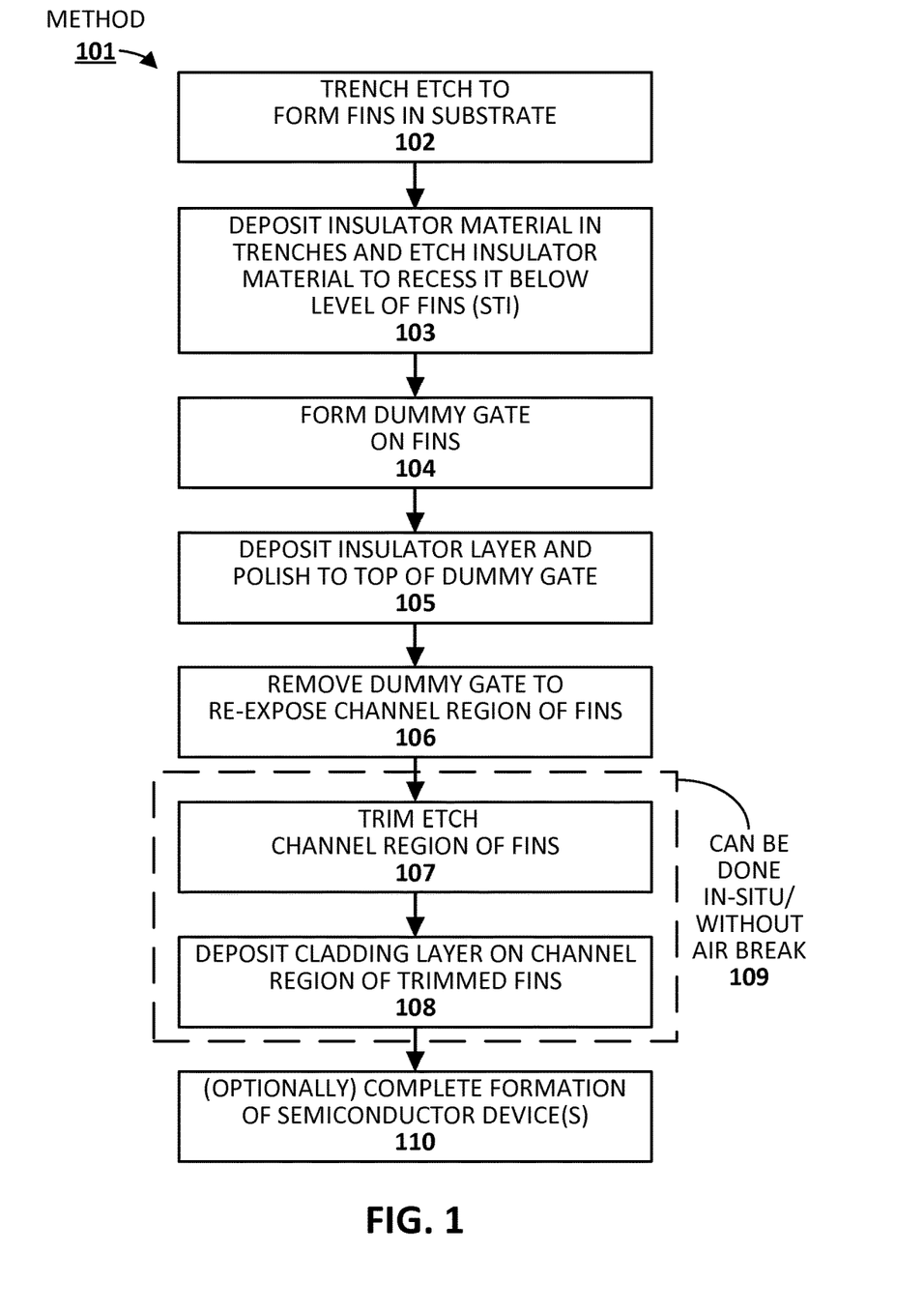
FIG. 1 shows a method of forming finned transistor device(s) including sculpting and cladding the channel region of the fins, in accordance with one or more embodiments of the present disclosure.

FIG. 1 shows a method 101 of forming finned transistor device(s) including sculpting and cladding the channel region of the fins, in accordance with one or more embodiments of the present disclosure. As will be apparent in light of this disclosure, sculpting and cladding the channel region of the fins is performed during a replacement gate process, such as a replacement metal gate (RMG) process. FIGS. 2-9 illustrate example structures that are formed as the process flow or method 101 of FIG. 1 is carried out, in accordance with some embodiments. Although method 101 of FIG. 1 and the structures shown in FIGS. 2-9 are depicted and described herein in the context of finned transistor configurations (e.g., tri-gate or finFET), similar principles and techniques as variously described herein may be used for other semiconductor devices and transistor configurations, including, for example, planar, dual-gate, gate-all-around (e.g., nanowire/nanoribbon), and other suitable devices and configurations, as will be apparent in light of this disclosure.

Figure 2:
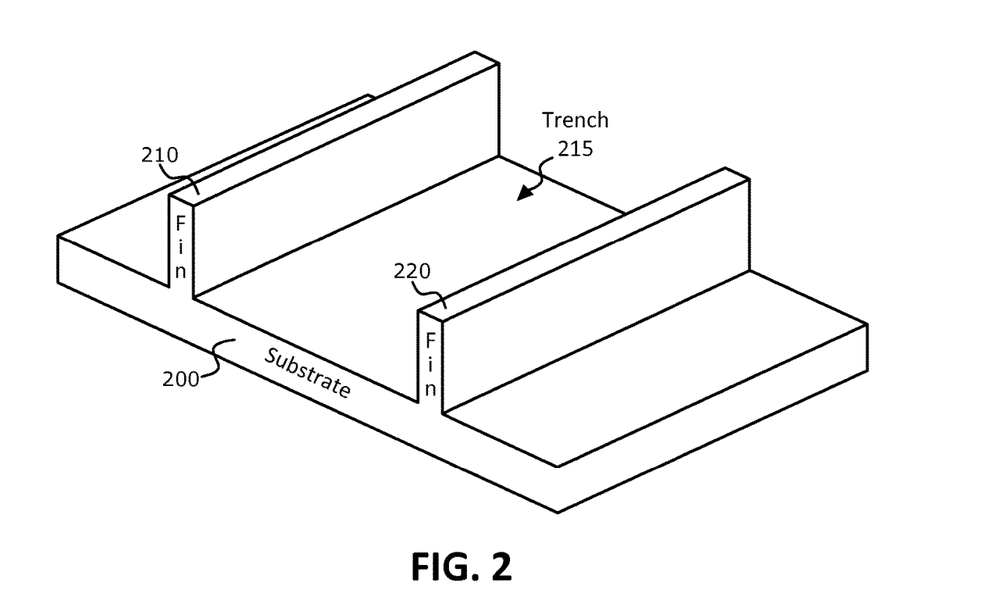
FIG. 2 illustrates a perspective view of a semiconductor substrate including fins after a trench etch was performed to form the fins in the substrate, in accordance with an embodiment.

FIG. 2 illustrates a perspective view of semiconductor substrate 200 including fins 210 and 220 after trench etch 102 was performed to form fins 210 and 220 in substrate 200, in accordance with an embodiment. In some cases, method 101 may include initially providing substrate 200 such that trench etch 102 can be performed on the provided substrate 200. Substrate 200 may include, be formed from, deposited with, or grown from silicon, polycrystalline silicon, or single crystal silicon, for example. Substrate 200 may be formed using various other suitable technologies for forming a silicon base or substrate, such as a silicon single crystal wafer. Substrate 200 may be implemented, for example, with a bulk silicon, a silicon-on-insulator configuration (SOI), or with multi-layered structures, including those substrates upon which fins are formed prior to a subsequent gate patterning process. In other implementations, substrate 200 may be formed using alternate materials, which may or may not be combined with silicon, such as germanium. In a more general sense, any material that may serve as a foundation upon which a semiconductor device may be built can be used in accordance with embodiments of the present disclosure.

With further reference to FIG. 2, and as previously described, fins 210 and 220 were formed in substrate 200 after trench etch 102 was performed. Therefore, in this embodiment, fins 210 and 220 are formed on and from substrate 200. In other embodiments, fins 210 and 220 may be formed, grown, or produced by other suitable processes. For example, in some cases, fins 210 and 220 may be grown (e.g., epitaxially) from trenches formed in substrate 200. FIG. 2 also shows trench 215 formed between fins 210 and 220. Fins 210 and 220 can be formed using any suitable techniques, as will be apparent in light of this disclosure. For example, in some cases, trench etch 102 may include patterning and etching a thickness of substrate 200 using a resist or hardmask to form fins 210 and 220. In some such cases, multiple resist or hardmask layers may be used for the patterning materials. In some cases, trench etch 102 may include using an $O_2$ or $O_2$/Ar plasma etch at pressures in the 10-100 mTorr range, and at room temperature, for example.

As can be seen in FIG. 2, fins 210 and 220 are depicted as rectangular in shape for ease of description. However, the fins as variously described herein need not be so limited. For example, in other embodiments, the fins formed during trench etch 102 may have a rounded top, a triangular shape, or some other suitable fin shape as will be apparent in light of this disclosure. As will also be apparent in light of this disclosure, fins 210 and 220 may be used for n-type MOS devices (n-MOS), p-type MOS devices (p-MOS), or a CMOS device (e.g., where fin 210 will be an n-type MOS and fin 220 will be a p-type MOS), for example. Also note that although only two fins 210 and 220 (and trench 215 formed between) are shown for ease of description; however, it is contemplated that any number of similar fins and trenches may be formed on substrate 200 (e.g., hundreds of fins, thousands of fins, millions of fins, billions of fins, etc.) and benefit from the techniques described herein.

Figure 3:
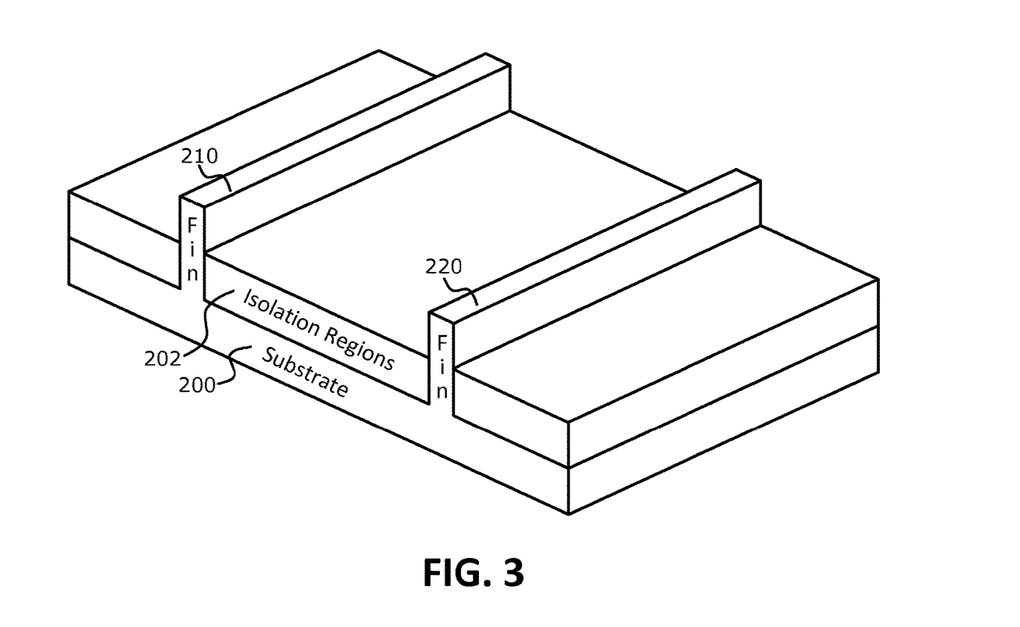
FIG. 3 illustrates a perspective view of the structure of FIG. 2 after depositing oxide material in the trenches and etching the trench oxide material to recess it below the level of the fins, in accordance with an embodiment

FIG. 3 illustrates a perspective view of the structure of FIG. 2 including shallow trench isolation (STI), provided by isolation regions 202, after depositing 103 insulator material in the trenches and etching the insulator material to recess it below the level of fins 210 and 220, in accordance with an embodiment. Deposition 103 to form isolation regions 202 may include atomic layer deposition (ALD), chemical vapor deposition (CVD), spin-on deposition (SOD), high-density plasma (HDP), plasma enhanced chemical deposition (PECVD), and/or some other suitable technique. In cases where patterning hardmask was used to form fins 210 and 220, the hardmask can be removed prior to depositing the trench oxide material. In some cases, the insulator or oxide material may be polished flat to the level of the top of fins 210 and 220, prior to etching the material to recess it below the level of fins 210 and 220. Isolation regions 202 may comprise, for example a dielectric, such as silicon dioxide ($SiO_2$). However, the isolation regions 202 may be any insulator, oxide, or inter-layer dielectric (ILD) material which provides the desired amount of electrical isolation for a given target application or end-use, as will be apparent in light of this disclosure.

Figure 4:
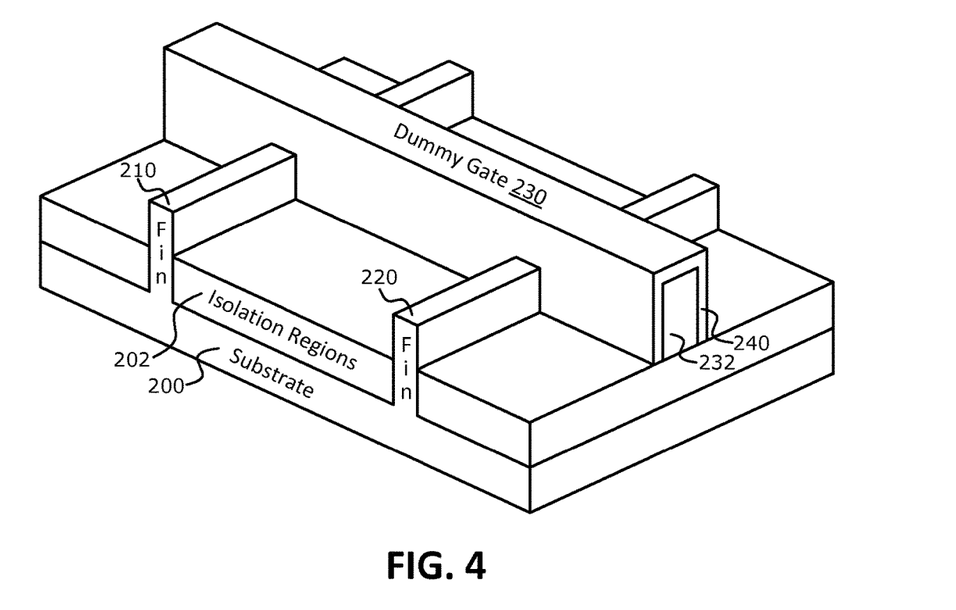
FIG. 4 illustrates a perspective view of the structure of FIG. 3 including a dummy gate after forming the same on the fins, in accordance with an embodiment

FIG. 4 illustrates a perspective view of the structure of FIG. 3 including dummy gate 230 after forming 104 the same on fins 210 and 220, in accordance with an embodiment. As previously described, the techniques disclosed herein for sculpting and cladding fins 210 and 220 can be performed during the replacement gate process, which may also be known as a replacement metal gate (RMG) process. In this embodiment, dummy gate 230 can first be deposited by depositing a dummy gate dielectric/oxide and dummy gate electrode 232 (e.g., dummy polysilicon). The resulting structure can be patterned and spacer material 240 can be deposited and etched to form the structure shown in FIG. 4. Such depositions, patterning, and etching can be done using any suitable techniques, as will be apparent in light of this disclosure. Note that dummy gate oxide is not shown, because it is under the dummy electrode/polysilicon layer 232, in this example embodiment. Also note that dummy gate 230 is indicated on top of spacer material 240 for ease of reference and that dummy gate 230 (which includes dummy gate oxide and dummy electrode/polysilicon layer 232) as referred to herein may or may not include spacer material 240 when being discussed.

Figure 5:
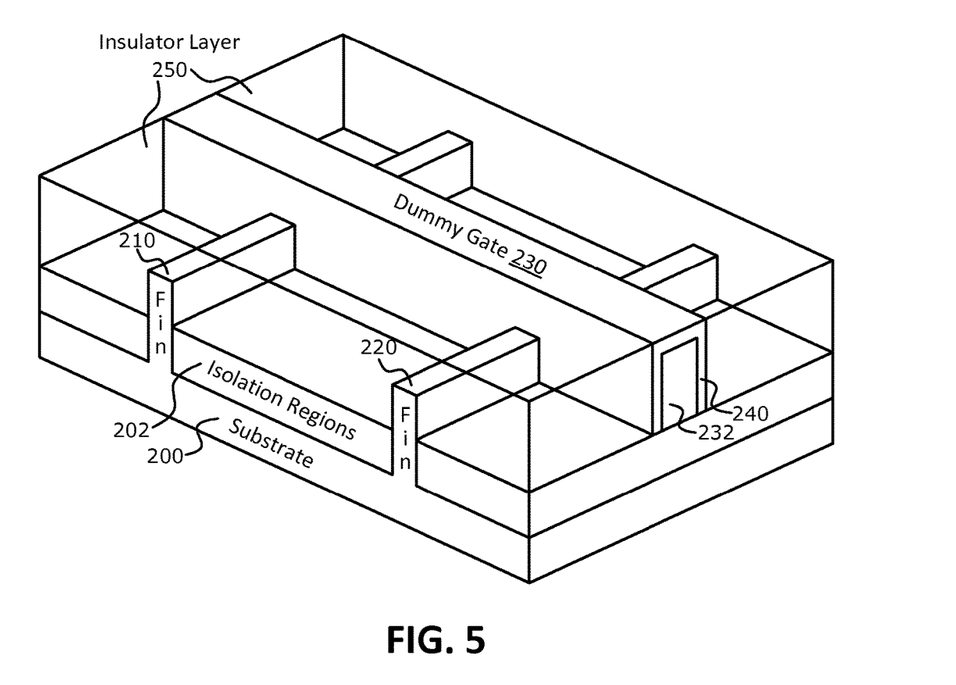
FIG. 5 illustrates a perspective view of the structure of FIG. 4 including an insulator layer after depositing the same and polishing the insulator layer to the top of the dummy gate, in accordance with an embodiment.

FIG. 5 illustrates a perspective view of the structure of FIG. 4 including insulator layer 250 after depositing 105 the same and polishing layer 250 to the top of dummy gate 230, in accordance with an embodiment. Insulator layer 250 may comprise any suitable filler material, including a dielectric material, such as $SiO_2$, deposited by ALD, CVD, SOD, HDP, PECVD, and/or some other suitable technique, as will be apparent in light of this disclosure.

Figure 6A:
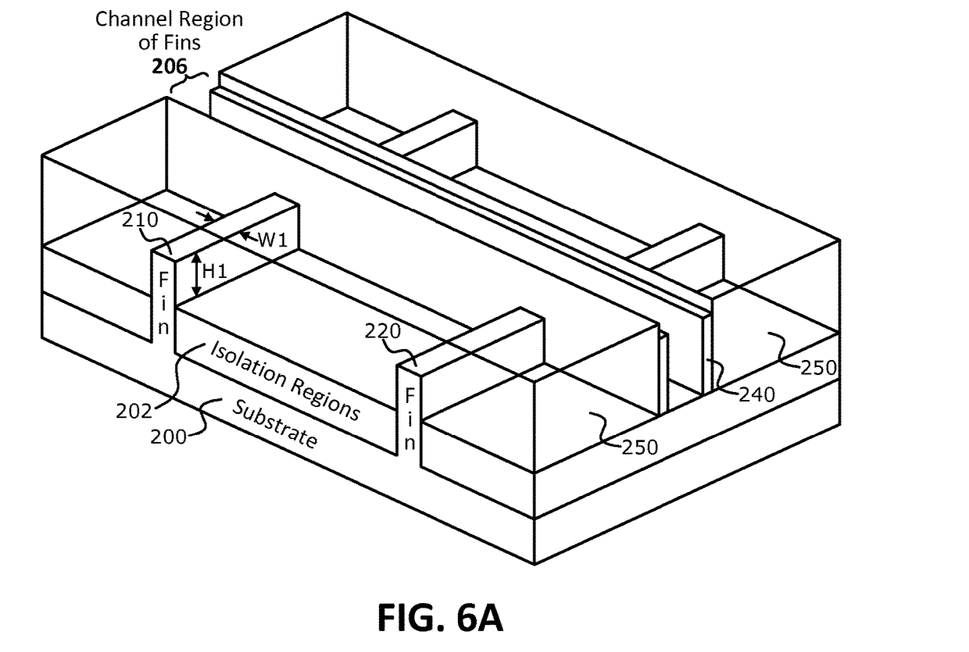
FIG. 6A illustrates a perspective view of the structure of FIG. 5 after removing the dummy gate to re-expose the channel region of the fins, in accordance with an embodiment.
Figure 6B:
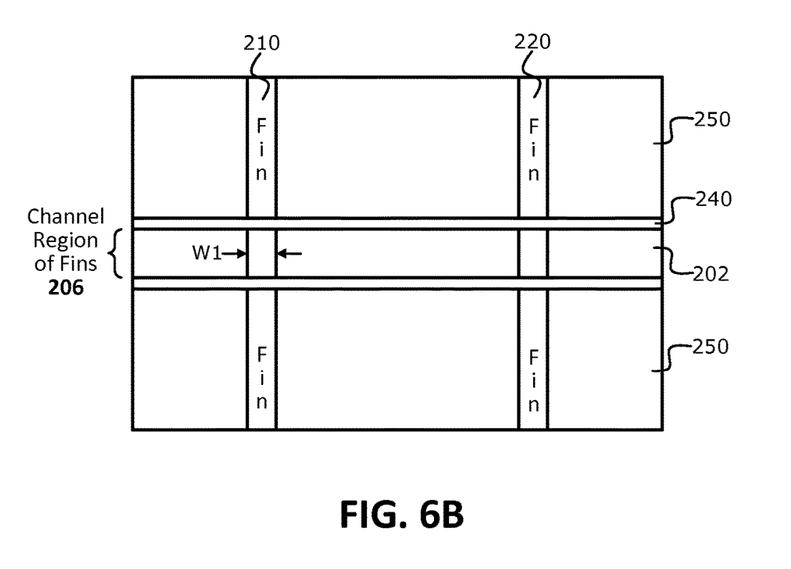
FIG. 6B illustrates a top planar view of the structure shown in FIG. 6A.

FIG. 6A illustrates a perspective view of the structure of FIG. 5 after removing 106 dummy gate 230 to re-expose the channel region 206 of fins 210 and 220 (or what may become the channel region once the device is fully fabricated), in accordance with an embodiment. Removing 106 dummy gate 230, may include removing any capping layer (e.g., formed by spacer material 240) on top of the dummy gate, and then removing dummy gate electrode/poly-Si 232 and dummy gate oxide. Such removal may be done using any suitable etch, polish, and/or clean process, as will be apparent in light of this disclosure. FIG. 6B illustrates a top planar view of the structure shown in FIG. 6A. As can be seen in this top planar view, channel region 206 of fins 210 and 220 have been re-exposed. As can also be seen, and as will be discussed in more detail below, fins 210 and 220 each have a first width W1.

Figure 6C:
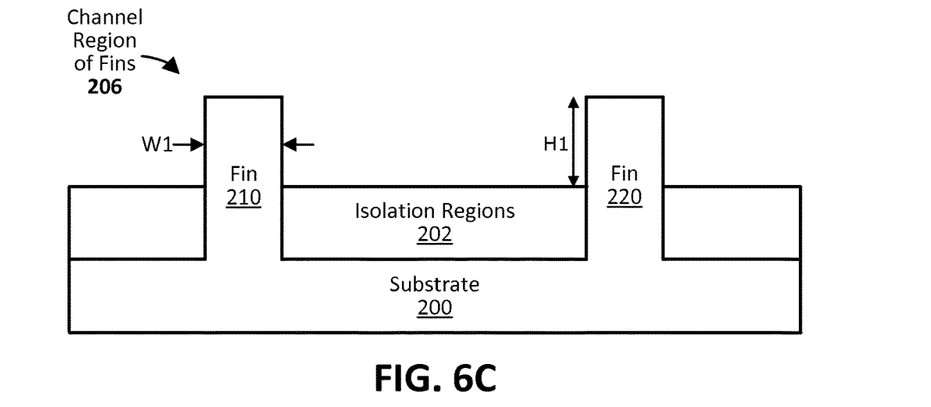
FIG. 6C illustrates a front cross-section view taken perpendicularly to the fins and across the channel region of the structure shown in FIG. 6A.

FIG. 6C illustrates a front cross-section view taken perpendicularly to the fins and across the channel region 206 of the structure shown in FIG. 6A. As can be seen in FIG. 6C, fins 210 and 220 each have a first width W1 and first height H1. Although fins 210 and 220 need not have the same initial width W1 and height H1, they are the same in this embodiment for ease of description. Note that first height H1 as used herein is the distance from the top of isolation region 202 to the top of the fins 210 and 220. Also note that the source and drain regions of fins 210 and 220 (or what may become the source and drain regions once the device is fully fabricated) start out with the same initial/first width W1 and height H1 as the channel region 206 of fins 210 and 220. For example, as can be seen in FIGS. 6A-B, the initial fin width W1 and height H1 is the same in the source/drain regions as it is in the channel region 206. In some embodiments, and as will be apparent in light of this disclosure, the first width W1 may be determined by trench etch 102, which was performed to form fins 210 and 220 in substrate 200.

Figure 7:
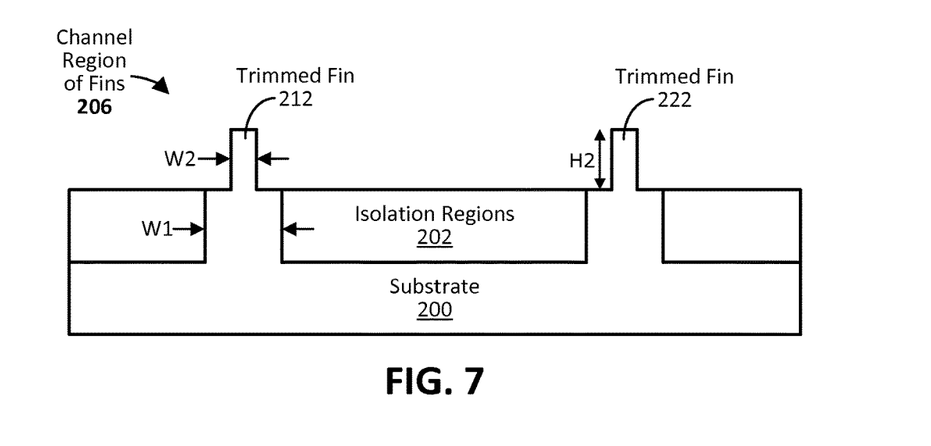

FIG. 7 continues from FIG. 6C and illustrates the resulting structure after performing trim etch 107 of the channel region 206 of fins 210 and 220 to achieve trimmed fins 212 and 222, respectively, in accordance with an embodiment. In some embodiments, trim etch 107 may be performed using and/or inside of an epitaxial deposition tool with provisions for ion processing within the same vacuum system or an epitaxial reactor. In some embodiments, trim etch may include, for example: 1) low ion energy plasma processing using chlorine (Cl) or fluorine (F) based chemistry in inert carrier (such as argon (Ar), for example) or 2) thermal processing. In some embodiments, using Cl or F based chemistry may include using less than 5 kW (or less than 1 kW) of radio frequency energy, such as for between 10 and 40 seconds. In some embodiments, the low ion energy plasma processing may use an epitaxial deposition tool and a Cl based chemistry to achieve trim etch 107. One such example includes using low energy Cl containing plasma under the following conditions: 200 mT, 10 sccm $Cl_2$, 100 sccm $H_2$, 300 sccm Ar, 50 W, ion energy 2 eV, 20 seconds. In some embodiments, the thermal processing may employ epitaxial reactor or wafer chamber processing to achieve trim etch 108. In some embodiments, the thermal processing may employ an epitaxial deposition reactor with $Cl_2$ in the temperature range of 500-700 degrees C. or HCl in the temperature range of 700-900 degrees C., such as for between 20 and 120 seconds, for example. One such example includes thermal processing in an epitaxial reactor under the following conditions: 750 degrees C., 100 sccm HCl, 10000 sccm $H_2$, 20 T, 60 seconds. Any suitable etching process may be used for trim etch 107 as will be apparent in light of this disclosure.

As can be seen in FIG. 7, trimmed fins 212 and 222 have each been sculpted/trimmed to second width W2 and second height H2, in this example embodiment. Recall that only the channel region 206 of fins 210 and 220 were sculpted/trimmed, resulting in trimmed fins 212 and 222. The source/drain regions of fins 210 and 220 are unaffected by trim etch 107 in this example embodiment, because they are covered by at least insulator layer 250 (e.g., as shown in FIGS. 6A-B). In some embodiments, W2 may be equal to or less than W1. In some embodiments, H2 may be equal to or less than H1. In some embodiments, W1 may be greater than 15 nm and W2 may be 15 nm or less. In some embodiments, W1 may be between 1 nm and 15 nm greater than W2. In some embodiments, W1 may be between 2 nm and 6 nm greater than W2. In some embodiments, W1 may be greater than 10 nm (e.g., 15, 20, or 30 nm wide). In some embodiments, W2 may be 15 nm or less (e.g., 15, 10, or 7 nm wide). In some embodiments, W2 may be at least 5 nm. In some embodiments, H2 may be at least 20 nm. In some embodiments, H1 may be no more than 5 nm greater than H2. In some embodiments, it may be desirable to ensure that H2 is at least 20 nm after trim etch 107 is performed. Thus, in some embodiments, it may be desirable to start with fins having a high initial height H1 (e.g., at least 25, 30, 50, or 75 nm), to ensure a sufficient trimmed fin height H2 is remaining after trim etch 107. Note that, in this example embodiment, trimmed portions 212 and 222 of fins 210 and 220 are above isolation regions 202, and that the fins maintained their original width W1 in the portions next to or within isolation regions 202, as shown, for example, in FIG. 7.

Recall that although fins 210 and 220, as well as trimmed fin portions 212 and 222, are depicted as rectangular in shape, the disclosure need not be so limited. In some embodiments, where the fins have an irregular width from top to bottom, only a portion of the fins may be sculpted during trim etch 107. For example, in cases where the initially formed fins are tapered (e.g., where the top is thinner than the base), it may be desirable to primarily sculpt or only sculpt the bottom portion of the fin during trim etch 107. In such cases, the sculpting may be performed to achieve a more consistent width for the entirety of the channel portion of the fin. For example, trim etch 107 may be performed in such cases to shape the fins to be straight (rather than tapered). In another embodiment, the fin will have a saddle shape, such that the height and width are greatest at the edges of the channel where the fin meets the spacer sidewall. In such embodiments, in the center of the channel, the fin will be shorter and narrower. Other suitable configurations or variations for performing trim etch 107 will depend on a given application and will be apparent in light of this disclosure.

Figure 8:
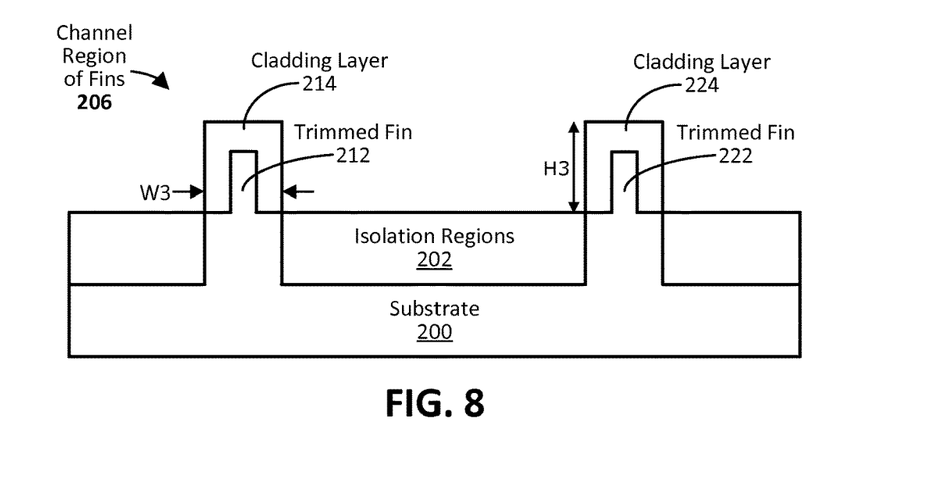
FIG. 8 continues from FIG. 7 and illustrates the resulting structure after depositing a cladding layer in the channel region on the trimmed fins, in accordance with an embodiment.

FIG. 8 continues from FIG. 7 and illustrates the resulting structure after depositing 108 cladding layer 214 and 224 in channel region 206 on trimmed fins 212 and 222, respectively, in accordance with an embodiment. In some embodiments, deposition (or epitaxial growth) 108 may include using atomic layer epitaxy (ALE), CVD, metal-organic chemical vapor deposition (MOCVD), metal-organic vapor phase epitaxy (MOVPE), gas source-molecular beam epitaxy (GS-MBE), rapid thermal (RT)-CVD, ultra-high vacuum (UHV)-CVD, or some other suitable technique as will be apparent in light of this disclosure. In some embodiments, deposition 108 may be selective, such that cladding layer 214 and 224 is only deposited on or grows from trimmed fins 212 and 222, and not from the oxide materials (e.g., spacer 240 and insulator layer 250). In some such embodiments, growth conditions (such as growth temperature, pressure of gas flux, etc.), may define the selectivity of the epitaxial growth of cladding layer 214 and 224. In some embodiments where deposition 108 is selectively grown only on trimmed fins 212 and 222, the selective growth may be achieved using hardmasking or by forming oxide layers over the materials that are not desired to have the cladding material deposited thereon.

In some embodiments, deposition 108 is performed in-situ 109 (or without air break) after performing trim etch 107. For example, trim etch 107 and deposition 108 may be performed in a vacuum sealed environment/system, and robots may be used to move the work piece as needed (e.g., between various areas/chambers within the environment/system). In such an example, performing trim etch 107 and deposition 108 in-situ 109 may include keeping or maintaining the work piece (which includes substrate 200 and its included structure, such as trimmed fins 212 and 222) within the vacuum sealed environment/system so that the work piece is not exposed to air, even though it may be moved into different areas/chambers within the environment/system. In some embodiments, deposition 108 is performed immediately after trim etch 107. In other embodiments, trim etch 107 may be performed outside of the epitaxial deposition toolset (ex-situ) or an air break may occur. However, fin width trim etches that are performed ex-situ (or allow for an air break) may rely on dry etching, which can involve high energy ion bombardment, oxidation, and etch residues that can all be damaging to the quality of subsequently deposited layers (e.g., a subsequently deposited cladding layer). Therefore, in some embodiments, performing trim etch 107 in-situ may increase the quality of trimmed fins 212 and 222 for subsequent deposition 108 of cladding layer 214 and 224.

With further reference to FIG. 8, cladding layer 214 and 224 on trimmed fins 212 and 222 create clad trimmed fins having a third width (W3) and a third height (H3), in this example embodiment. Although W3 and H3 are depicted as being the same width and height as W1 and H1, the disclosure is not so limited. In some embodiments, W3 may be less than, equal to, or greater than W1. In some embodiments, H3 may be less than, equal to, or greater than H1. In some embodiments, W3 may be less than or equal to 20 nm. In some embodiments, the aspect ratio (height:width) of the clad trimmed fin is at least 2:1 or 3:1. In some embodiments, W3 may be 5 nm, 8 nm, 12 nm, 17 nm, 20 nm, or some other suitable width, as will be apparent in light of this disclosure. In some embodiments, the material of cladding layer 214 and 224 may include germanium (Ge) and may be SiGe in some such embodiments (e.g., 70 percent Si and 30 percent Ge, or 30 percent Si and 70 percent Ge). In some embodiments, the percentage of Ge in cladding layer 214 and 224 is between 0 and 100%. In some embodiments, cladding layer 214 and 224 has at least 10 percent Ge, at least 30 percent Ge, between 30 and 50 percent Ge, between 30 and 100 percent Ge, between 50 and 100 percent Ge, or some other suitable minimum, maximum, or range of Ge. Cladding layer 214 and 224 may be a device layer on which semiconductor devices are formed, such as p-MOS, n-MOS, or CMOS finned transistor devices, as will be discussed in more detail below.

Figure 9:
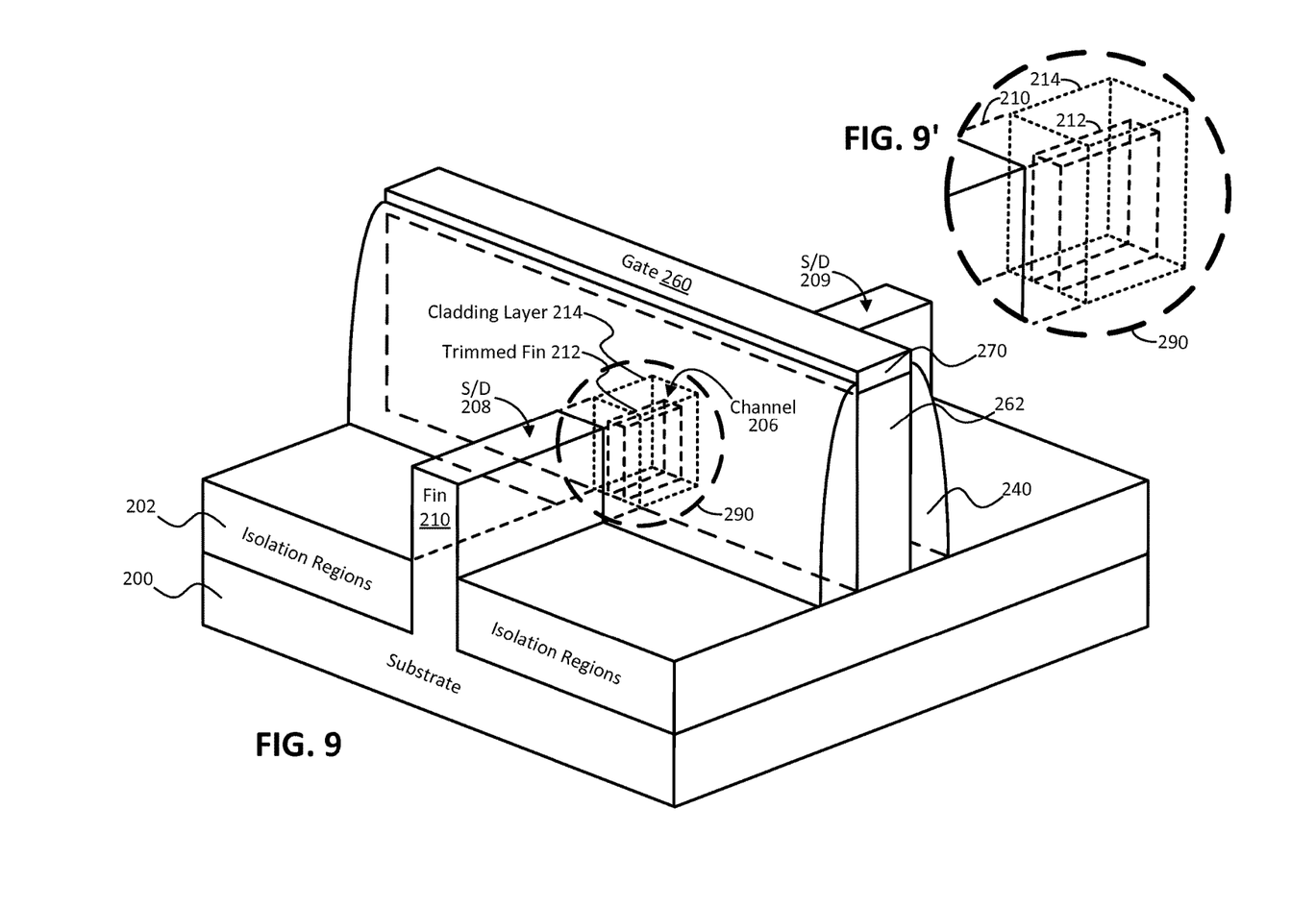
FIG. 9 illustrates a perspective view of the structure of FIG. 8 after additional processing to form a semiconductor device, in accordance with one or more embodiments.

Method 101 of FIG. 1 may optionally continue with forming 110 one or more semiconductor devices as is conventionally done, in accordance with some embodiments. For example, FIG. 9 illustrates a perspective view of the structure of FIG. 8 after additional processing to form a semiconductor device (e.g., after completing the replacement gate process and performing source/drain contact trench etch). In this example embodiment, a finned transistor (e.g., a tri-gate or finFET) has been formed. As can be seen in FIG. 9, only one fin 210 is shown for illustrative purposes, and fin 210 is trimmed 212 and clad 214 in channel region 206. FIG. 9' shows an enlarged view 290 of the clad trimmed fin in the channel region of the structure shown in FIG. 9.

As can also be seen in FIG. 9, fin 210 maintained first width W1 in the source and drain regions 208 and 209 and these source/drain regions were left unclad during deposition 108 (recall that these source/drain regions were closed off by insulator layer 250 at the time of trim etch 107 and deposition 108 of the cladding layer). In other words, the source/drain regions 208 and 209 of fin 210 were unaffected by trim etch 107 and deposition 108, since these processes were performed when only the channel region 206 of fins 210 and 220 were exposed during the replacement gate process. As a result, the adjacent resistance paths through the source/drain regions (as well as any related tip regions and the contacts) may all be lower due to the physically wider dimension of the fin in the source/drain regions (as compared to the fin in the channel region). Note that, in this example embodiment, source/drain regions 208 and 209 are shown as a part of the original fin 210 formed on and from substrate 200. However, the present disclosure need not be so limited. For example, in some embodiments, the source/drain regions may be removed and replaced with another material, and therefore may have no portion of the original fin in them. In other embodiments, the source/drain regions of the fin may also undergo thinning, sculpting, reshaping, cladding, or other various suitable processes. Therefore, in some embodiments, the width of the fin portion in the source/drain regions may not be equivalent to the original fin width (e.g., width W1 shown in FIGS. 6C and 7).

With further reference to FIG. 9, gate electrode 262 was deposited/formed to replace dummy gate electrode 232, in this embodiment, and optional gate dielectric (not shown) may be formed directly under gate electrode 262, as conventionally done. As can also be seen, spacers 240 are formed around gate 260 (which consists of gate electrode 262 and the gate dielectric) and gate 260 also has hardmask 270 formed thereon (which may be removed to form a metal gate contact). Gate electrode 262 and gate dielectric may be formed using any suitable technique and from any suitable materials. For example, replacement gate 260 can be formed using any of a wide variety of processes, including CVD, physical vapor deposition (PVD), a metal deposition process, and/or any combination thereof. In some embodiments, gate electrode 262 may comprise any of a wide range of materials, such as polysilicon or various suitable metals (e.g., aluminum (Al), tungsten (W), titanium (Ti), copper (Cu), or any other suitable metal or alloy). Other suitable configurations, materials, and processes for forming a replacement gate or replacement metal gate (RMG) will depend on a given application and will be apparent in light of this disclosure.

With further reference to FIG. 9, an etching process (e.g., any suitable wet or dry etching process) was performed to expose the source and drain regions 208 and 209 of fin 210 as shown. Method 101 to form a semiconductor device (specifically, a finned transistor device) may include additional or alternative processes as will be apparent in light of this disclosure. For example, the method may continue with source/drain processing and may include the deposition of source/drain metal contacts or contact layers. Such metallization of the source and drain contacts can be carried out using a silicidation process (generally, deposition of contact metal and subsequent annealing). For instance, silicidation with nickel, aluminum, nickel-platinum or nickel-aluminum or other alloys of nickel and aluminum, or titanium with or without germanium pre-amorphization implants can be used to form a low resistance silicide/germanide.

As previously mentioned, method 101 and the structures shown in FIGS. 2-9 are depicted and described herein in the context of finned transistor configurations (e.g., tri-gate or finFET) for ease of illustration. However, the principles and techniques as variously described herein may be used for other semiconductor devices and transistor configurations, including, for example, planar, dual-gate, gate-all-around (e.g., nanowire/nanoribbon), and other suitable devices and configurations. Also recall that the structures described herein may be used for the formation of p-MOS, n-MOS, or CMOS transistor devices, depending upon the particular configuration. Numerous variations and configurations will be apparent in light of this disclosure.

Example System

Figure 10:
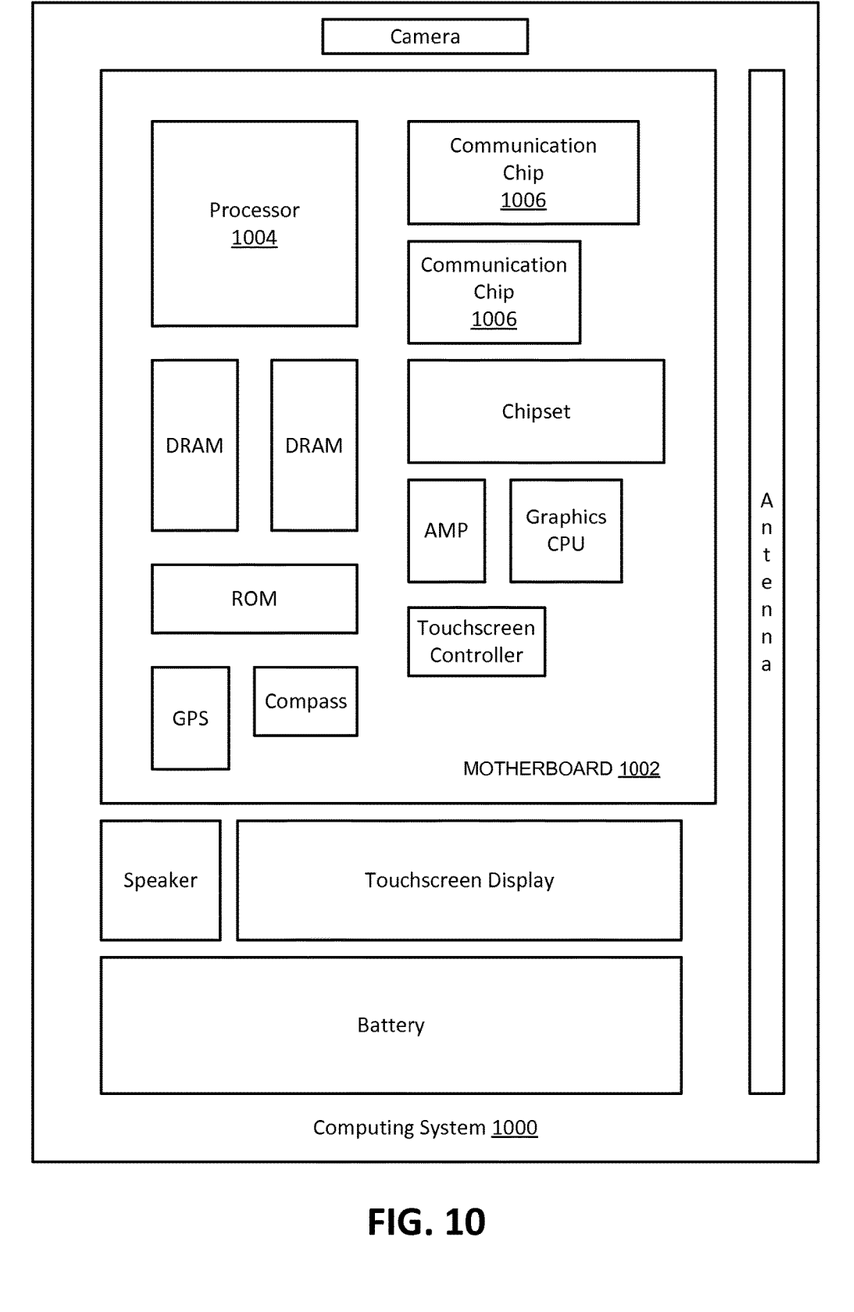
FIG. 10 illustrates a computing system implemented with one or more semiconductor devices (e.g., transistors) configured in accordance with one or more embodiments of the present disclosure.

FIG. 10 illustrates a computing system 1000 implemented with one or more semiconductor devices (e.g., transistors) configured in accordance with one or more embodiments of the present disclosure. As can be seen, the computing system 1000 houses a motherboard 1002. The motherboard 1002 may include a number of components, including but not limited to a processor 1004 and at least one communication chip 1006, each of which can be physically and electrically coupled to the motherboard 1002, or otherwise integrated therein. As will be appreciated, the motherboard 1002 may be, for example, any printed circuit board, whether a main board or a daughterboard mounted on a main board or the only board of system 1000, etc.

Depending on its applications, computing system 1000 may include one or more other components that may or may not be physically and electrically coupled to the motherboard 1002. These other components may include, but are not limited to, volatile memory (e.g., DRAM), non-volatile memory (e.g., ROM), a graphics processor, a digital signal processor, a crypto processor, a chipset, an antenna, a display, a touchscreen display, a touchscreen controller, a battery, an audio codec, a video codec, a power amplifier, a global positioning system (GPS) device, a compass, an accelerometer, a gyroscope, a speaker, a camera, and a mass storage device (such as a hard disk drive, compact disk (CD), digital versatile disk (DVD), and so forth). Any of the components included in computing system 1000 may include one or more semiconductor device structures as variously described herein (e.g., a finned transistor fabricated with sculpted/trimmed and clad channel regions). These transistor structures can be used, for instance, to implement an on-board processor cache or memory array. In some embodiments, multiple functions can be integrated into one or more chips (e.g., for instance, note that the communication chip 1006 can be part of or otherwise integrated into the processor 1004).

The communication chip 1006 enables wireless communications for the transfer of data to and from the computing system 1000. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication chip 1006 may implement any of a number of wireless standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. The computing system 1000 may include a plurality of communication chips 1006. For instance, a first communication chip 1006 may be dedicated to shorter range wireless communications such as NFC, Wi-Fi, and Bluetooth, and a second communication chip 1006 may be dedicated to longer range wireless communications such as GPS, EDGE, GPRS, CDMA, WiMAX, LTE, Ev-DO, and others.

The processor 1004 of the computing system 1000 includes an integrated circuit die packaged within the processor 1004. In some embodiments, the integrated circuit die of the processor includes onboard memory circuitry that is implemented with one or more semiconductor or transistor structures as variously described herein. The term "processor" may refer to any device or portion of a device that processes, for instance, electronic data from registers and/or memory to transform that electronic data into other electronic data that may be stored in registers and/or memory.

The communication chip 1006 may also include an integrated circuit die packaged within the communication chip 1006. In accordance with some such example embodiments, the integrated circuit die of the communication chip includes one or more devices implemented with one or more transistor structures as variously described herein (e.g., on-chip processor or memory). As will be appreciated in light of this disclosure, note that multi-standard wireless capability may be integrated directly into the processor 1004 (e.g., where functionality of any chips 1006 is integrated into processor 1004, rather than having separate communication chips). Further note that processor 1004 may be a chip set having such wireless capability. In short, any number of processor 1004 and/or communication chips 1006 can be used. Likewise, any one chip or chip set can have multiple functions integrated therein.

In various implementations, the computing system 1000 may be a laptop, a netbook, a notebook, a smartphone, a tablet, a personal digital assistant (PDA), an ultra-mobile PC, a mobile phone, a desktop computer, a server, a printer, a scanner, a monitor, a set-top box, an entertainment control unit, a digital camera, a portable music player, or a digital video recorder. In further implementations, the system 1000 may be any other electronic device that processes data or employs one or more semiconductor or transistor devices as variously described herein.

Further Example Embodiments

The following examples pertain to further embodiments, from which numerous permutations and configurations will be apparent.

Example 1 is a semiconductor device comprising: one or more fins formed on and from a substrate, each fin having source and drain regions and a channel region, wherein each fin has a first width (W1) in the source and drain regions and a second width (W2) in the channel region, and wherein W2 is less than W1; and a cladding layer deposited on the channel region of the one or more fins, wherein the clad channel region of each fin has a third width (W3).

Example 2 includes the subject matter of Example 1, wherein the substrate material comprises silicon (Si).

Example 3 includes the subject matter of any of Examples 1-2, wherein the cladding layer material comprises germanium (Ge) or silicon germanium (SiGe).

Example 4 includes the subject matter of any of Examples 1-3, wherein the cladding layer is absent from the source and drain regions of the one or more fins.

Example 5 includes the subject matter of any of Examples 1-4, wherein W1 is greater than 15 nm and W2 is 15 nm or less.

Example 6 includes the subject matter of any of Examples 1-5, wherein W1 is between 2 nm and 6 nm greater than W2.

Example 7 includes the subject matter of any of Examples 1-6, wherein W1 is greater than 10 nm.

Example 8 includes the subject matter of any of Examples 1-7, wherein W2 is at least 5 nm.

Example 9 includes the subject matter of any of Examples 1-8, wherein W3 is less than 20 nm.

Example 10 includes the subject matter of any of Examples 1-9, wherein the semiconductor device is a p-MOS, n-MOS, or CMOS transistor device.

Example 11 includes an integrated circuit comprising the subject matter of any of Examples 1-10.

Example 12 includes a mobile computing system comprising the subject matter of any of Examples 1-10.

Example 13 is a method of forming a semiconductor device, the method comprising: performing a trench etch to form fins and trenches in a substrate, wherein each fin has a first width (W1); depositing an insulator material in the trenches; forming a dummy gate on a channel region of the fins; depositing an additional insulator material over topography of the fins and dummy gates; removing the dummy gate to re-expose the channel region of the fins; performing a trim etch on the re-exposed channel region of the fins, wherein the trimmed channel region of each fin has a second width (W2), and wherein W2 is less than W1; and depositing a cladding layer on the trimmed channel region of the fins, wherein the clad channel region of each fin has a third width (W3).

Example 14 includes the subject matter of Example 13, wherein performing the trim etch and depositing the cladding layer are done in-situ or without air break.

Example 15 includes the subject matter of Examples 13-14, wherein depositing the cladding layer and performing the trim etch is done in an epitaxial deposition toolset or epitaxial reactor.

Example 16 includes the subject matter of any of Examples 13-15, wherein the trim etch comprises one of low ion energy plasma processing using chlorine based chemistry and thermal processing.

Example 17 includes the subject matter of any of Examples 13-16, wherein the trim etch comprises using chlorine based chemistry and using less than 5 kW of radio frequency energy for between 10 and 40 seconds.

Example 18 includes the subject matter of any of Examples 13-17, wherein the trim etch comprises using chlorine based chemistry and using less than 1 kW of radio frequency energy for between 10 and 40 seconds.

Example 19 includes the subject matter of any of Examples 13-16, wherein the trim etch comprises using thermal processing and using less than 900 degrees C. heat in an epitaxial reactor for between 20 and 120 seconds in the presence of HCl.

Example 20 includes the subject matter of any of Examples 13-16, wherein the trim etch comprises using thermal processing and using less than 700 degrees C. heat in an epitaxial reactor for between 20 and 120 seconds in the presence of $Cl_2$.

Example 21 includes the subject matter of any of Examples 13-20, wherein the substrate material comprises silicon (Si).

Example 22 includes the subject matter of any of Examples 13-21, wherein the cladding layer material comprises germanium (Ge) or silicon germanium (SiGe).

Example 23 includes the subject matter of any of Examples 13-22, wherein the cladding layer is absent from the source and drain regions of the one or more fins.

Example 24 includes the subject matter of any of Examples 13-23, wherein W1 is greater than 15 nm and W2 is 15 nm or less.

Example 25 includes the subject matter of any of Examples 13-24, wherein W1 is between 2 nm and 6 nm greater than W2.

Example 26 includes the subject matter of any of Examples 13-25, wherein W1 is greater than 10 nm.

Example 27 includes the subject matter of any of Examples 13-26, wherein W2 is at least 5 nm.

Example 28 includes the subject matter of any of Examples 13-27, wherein W3 is less than 20 nm.

Example 29 includes the subject matter of any of Examples 13-28, wherein the semiconductor device is a p-MOS, n-MOS, or CMOS transistor device.

Example 30 includes an apparatus comprising means for performing the subject matter of any of Examples 13-29.

Example 31 is a transistor device comprising: a substrate having a finned channel region; a gate electrode above the channel region; and source/drain regions adjacent to the channel region; wherein the finned channel region has a first width (W1) within one or more isolation regions and a second width (W2) above the isolation regions, and wherein W2 is less than W1.

Example 32 includes the subject matter of Example 31, wherein the finned channel region comprises silicon (Si).

Example 33 includes the subject matter of any of Examples 31-32, further comprising a cladding layer on a portion of the finned channel region.

Example 34 includes the subject matter of Example 33, wherein the cladding layer material comprises germanium (Ge) or silicon germanium (SiGe).

Example 35 includes the subject matter of any of Examples 33-34, wherein the cladding layer is absent from the source/drain regions.

Example 36 includes the subject matter of any of Examples 30-35, wherein W1 is greater than 15 nm and W2 is 15 nm or less.

Example 37 includes the subject matter of any of Examples 30-36, wherein W1 is between 2 nm and 6 nm greater than W2.

Example 38 includes the subject matter of any of Examples 30-37, wherein W1 is greater than 10 nm.

Example 39 includes the subject matter of any of Examples 30-38, wherein W2 is at least 5 nm.

Example 40 includes the subject matter of any of Examples 30-39, wherein the device is a p-MOS, n-MOS, or CMOS transistor device.

The foregoing description of example embodiments has been presented for the purposes of illustration and description. It is not intended to be exhaustive or to limit the present disclosure to the precise forms disclosed. Many modifications and variations are possible in light of this disclosure. It is intended that the scope of the present disclosure be limited not by this detailed description, but rather by the claims appended hereto. Future filed applications claiming priority to this application may claim the disclosed subject matter in a different manner, and may generally include any set of one or more limitations as variously disclosed or otherwise demonstrated herein.

What is claimed is:

1. A semiconductor device comprising:
    a source region and a drain region, the source and drain regions comprising germanium;
    a first gate spacer adjacent to the source region and a second gate spacer adjacent to the drain region;
    a fin of silicon, the fin having a portion between the source and drain regions, the portion including a first region under the first gate spacer, a second region under the second gate spacer, and an intervening region between the first and second regions, wherein the fin has a first width in the first and second regions, and the fin has a second width in the intervening region, and wherein the second width of the fin is less than the first width of the fin; and
    a cladding layer on top and side walls of the intervening region of the fin and between the first and second regions, the cladding layer comprising silicon and germanium, wherein the cladding layer being absent from the source and drain regions, wherein the combined width of the intervening region and the cladding layer is a third width equal to or less than the first width of the fin.

2. The semiconductor device of claim 1, wherein the fin is part of a substrate structure that includes the silicon of the fin.

3. The semiconductor device of claim 1, wherein the cladding layer has a germanium concentration between 50 and 100 percent.

4. The semiconductor device of claim 1, wherein the first width of the fin is greater than 15 nanometers and the second width of the fin is 15 nanometers or less.

5. The semiconductor device of claim 1, wherein the first width of the fin is between 2 and 6 nanometers greater than the second width of the fin.

6. The semiconductor device of claim 1, wherein the second width of the fin is at least 5 nanometers.

7. The semiconductor device of claim 1, wherein the third width of the fin is less than 20 nanometers.

8. The semiconductor device of claim 1, wherein the semiconductor device is a p-MOS, n-MOS, or CMOS transistor device.

9. An integrated circuit comprising the semiconductor device of claim 1.

10. A mobile computing system comprising the semiconductor device of claim 1.

11. The semiconductor device of claim 1, wherein the first and second gate spacers include chlorine or fluorine on sides facing the cladding layer.

12. The semiconductor device of claim 1, wherein the ratio of the combined height of the intervening region and the cladding layer to the third width is at least 2 to 1.

13. The semiconductor device of claim 1, wherein the ratio of the combined height of the intervening region and the cladding layer to the third width is at least 3 to 1.

14. A transistor device comprising:
   a fin of silicon extending from a silicon substrate and having
      a first portion between two isolation regions,
      two second portions above the first portion and below a corresponding two gate spacers, and
      a third portion above the first portion and between the second portions,
      wherein the first portion and the second portions have a first width, and the third portion has a second width less than the first width;
   a cladding layer on and beside the third portion and between the second portions, the cladding layer comprising silicon and germanium, wherein the combined width of the third portion and the cladding layer is a third width equal to or less than the first width;
   a gate structure above the cladding layer and between the gate spacers; and
   a source region and a drain region, the source and drain regions comprising germanium, the cladding layer being between the source and drain regions, wherein the cladding layer being absent from the source and drain regions.

15. The transistor device of claim 14, wherein the substrate includes bulk silicon from which the fin extends.

16. The transistor device of claim 14, wherein the cladding layer has a germanium concentration between 50 and 100 percent.

17. The transistor device of claim 14, wherein the first width is greater than 15 nanometers and the second width is 15 nanometers or less.

18. The transistor device of claim 14, wherein the gate spacers include chlorine or fluorine on sides facing the cladding layer.

19. The transistor device of claim 14, wherein the ratio of the combined height of the third portion and the cladding layer to the third width is at least 2 to 1.

20. The transistor device of claim 14, wherein the ratio of the combined height of the third portion and the cladding layer to the third width is at least 3 to 1.

21. The transistor device of claim 14, wherein the first width is between 2 and 6 nanometers greater than the second width.

22. The transistor device of claim 14, wherein the third width is less than 20 nanometers.

23. The transistor device of claim 14, wherein the transistor device is a p-MOS, n-MOS, or CMOS transistor device.

* * * * *